United States Patent
Schmidt

(10) Patent No.: US 11,958,366 B2
(45) Date of Patent: Apr. 16, 2024

(54) METHOD FOR OPERATING AN ELECTRICAL ENERGY STORE OF AN ELECTRICALLY OPERABLE MOTOR VEHICLE

(71) Applicant: Bayerische Motoren Werke Aktiengesellschaft, Munich (DE)

(72) Inventor: Jan Philipp Schmidt, Holzmaden (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 693 days.

(21) Appl. No.: 17/251,412

(22) PCT Filed: May 20, 2019

(86) PCT No.: PCT/EP2019/062992
§ 371 (c)(1),
(2) Date: Dec. 11, 2020

(87) PCT Pub. No.: WO2019/238361
PCT Pub. Date: Dec. 19, 2019

(65) Prior Publication Data
US 2021/0237580 A1    Aug. 5, 2021

(30) Foreign Application Priority Data

Jun. 14, 2018   (DE) .................. 10 2018 209 499.3

(51) Int. Cl.
*B60L 3/12*    (2006.01)
*B60L 58/13*   (2019.01)
(Continued)

(52) U.S. Cl.
CPC ............. *B60L 3/12* (2013.01); *B60L 58/13* (2019.02); *B60L 58/16* (2019.02); *B60L 58/18* (2019.02);
(Continued)

(58) Field of Classification Search
USPC ............... 320/104, 106, 107, 108, 109, 110
See application file for complete search history.

(56) References Cited

U.S. PATENT DOCUMENTS

| | | | |
|---|---|---|---|
| 2009/0140698 A1 | 6/2009 | Eberhard et al. | |
| 2009/0140700 A1 | 6/2009 | Eberhard et al. | |

(Continued)

FOREIGN PATENT DOCUMENTS

| | | | |
|---|---|---|---|
| CN | 102473974 A | 5/2012 | |
| CN | 102818997 A | 12/2012 | |

(Continued)

OTHER PUBLICATIONS

International Search Report (PCT/ISA/210) issued in PCT Application No. PCT/EP2019/062992 dated Jul. 31, 2019 with English translation (six (6) pages).

(Continued)

*Primary Examiner* — Brian Ngo
(74) *Attorney, Agent, or Firm* — Crowell & Moring LLP

(57) ABSTRACT

A device operates an electrical energy store for supplying components of an electrically operable motor vehicle, wherein operating limits are defined in each case for one or more characteristic variables of the energy store. A control unit prevents the operating limits from being exceeded during normal operation of the energy store. The device has an interface for receiving a user-side request message from an apparatus, the request message including change information about an intended shift in the operating limit of at least one of the characteristic variables. The device has a computing unit which is designed, upon receipt of the request message, to check and permit the shifting of the operating limit of at least one of the characteristic variables in accordance with at least one operational history which is stored for the energy store and which represents information derived from one or more of the characteristic variables of (Continued)

the energy store about past operating conditions of the energy store if at least one of the following conditions is satisfied: information determined from the at least one operational history and representing the current state of health satisfies a predetermined criterion; and/or a monetary transaction initiated by the computing unit in accordance with the current state of health has been completed.

20 Claims, 3 Drawing Sheets

(51) Int. Cl.
- *B60L 58/16* (2019.01)
- *B60L 58/18* (2019.01)
- *G01R 31/367* (2019.01)
- *G01R 31/382* (2019.01)
- *G01R 31/392* (2019.01)
- *G01R 31/396* (2019.01)
- *H01M 10/42* (2006.01)

(52) U.S. Cl.
CPC ......... *G01R 31/367* (2019.01); *G01R 31/382* (2019.01); *G01R 31/392* (2019.01); *G01R 31/396* (2019.01); *H01M 10/425* (2013.01); *B60L 2240/545* (2013.01); *B60L 2240/547* (2013.01); *B60L 2240/549* (2013.01); *B60L 2250/12* (2013.01); *B60L 2260/162* (2013.01); *B60L 2260/50* (2013.01); *H01M 2010/4271* (2013.01); *H01M 2010/4278* (2013.01)

(56) References Cited

U.S. PATENT DOCUMENTS

| 2011/0160992 A1* | 6/2011 | Crombez | B60W 30/182 |
| | | | 701/123 |
| 2012/0176096 A1 | 7/2012 | Mumelter et al. | |
| 2012/0316810 A1 | 12/2012 | Syed et al. | |
| 2016/0171794 A1 | 6/2016 | Brochhaus | |
| 2016/0221465 A1 | 8/2016 | Kratzer et al. | |
| 2016/0243957 A1 | 8/2016 | Boehm et al. | |

FOREIGN PATENT DOCUMENTS

| CN | 104412443 A | 3/2015 |
| CN | 105408163 A | 3/2016 |
| CN | 106532187 A | 3/2017 |
| DE | 10 2013 209 446 A1 | 11/2014 |
| DE | 10 2013 225 748 A1 | 6/2015 |
| EP | 3 050 739 A1 | 8/2016 |

OTHER PUBLICATIONS

German-language Written Opinion (PCT/ISA/237) issued in PCT Application No. PCT/EP2019/062992 dated Jul. 31, 2019 (seven (7) pages).

German-language Search Report issued in German Application No. 10 2018 209 499.3 dated Feb. 13, 2019 with partial English translation (13 pages).

Lambert, F., "Tesla Confirms That It Limits The Power Of Performance Vehicles After Too Many Launches With 'Launch Mode' [Updated]", Electrek, Dec. 23, 2016, XP055607637, Retrieved from https://electrek.co/2016/12/23/tesla-limiting-power-performance-launch-model/ (eight (8) pages).

Chinese-language Office Action issued in Chinese Application No. 201980035275.X dated Apr. 6, 2023 with English translation (19 pages).

Chinese-language Office Action issued in Chinese Application No. 201980035275.X dated Nov. 21, 2023 with English translation (18 pages).

\* cited by examiner

METHOD FOR OPERATING AN ELECTRICAL ENERGY STORE OF AN ELECTRICALLY OPERABLE MOTOR VEHICLE

BACKGROUND AND SUMMARY OF THE INVENTION

The invention relates to a device and a method for operating an electrical energy store, in particular for supplying power to components of an electrically operable motor vehicle, such as, for example, a battery electric vehicle (BEV) or a hybrid electric vehicle (HEV), which can be driven either by an internal combustion engine and/or an electric drive.

For an electrical energy store, which is used for supplying power to an electrical machine and is also referred to as a traction battery or high-voltage battery, operational limits are defined in each case for one or more characteristic variables. Characteristic variables may be, for example, a voltage, a current, a temperature, a state of charge (SoC) or the like. The exceeding of respective operational limits is prevented during normal operation of the energy store by a control unit of the energy store in order to avoid in particular damage to the electrical energy store or premature aging phenomena.

For the storage cells installed in an electrical energy store, a certain life is guaranteed by the manufacturer of the storage cells assuming a preset worst case scenario. An assumed load collective, an assumed temperature collective and a histogram of the operating states expected over the lifetime form the basis of the worst case scenario, which is also referred to as mission profile. In order to ensure this guaranteed life, the design of the electrical energy store needs to be based on a worst case scenario which corresponds to the worst possible (most severe) operating conditions and customer requests. This procedure means that from the production of the vehicle on, the maximum charging and discharging power over the lifetime is fixed. In addition, depending on a present state of health (SoH), a power enabled for a certain operating state is also limited.

For customers who have a less performant use profile than the worst case scenario on which the design is based, the electrical energy store is therefore 'overdesigned' and could therefore be more favorable. The above-described design of the electrical energy store does not, however, permit any individual design for customers with different use profiles.

The object of the invention is to provide a device and a method for operating an electrical energy store which enable greater flexibility in respect of different customer requests.

These objects are achieved by a device and a method according to the independent claims. Advantageous configurations result from the dependent patent claims.

In accordance with a first aspect, a device for operating an electrical energy store, in particular for supplying power to components of an electrically operable motor vehicle, is proposed. Operational limits are defined in each case for one or more characteristic variables of the energy store. The exceeding of these operational limits is prevented during normal operation of the energy store by a control unit. The device comprises an interface for receiving a user-side request message from an appliance, which contains modification information relating to an intended shift in the operational limit of at least one of the characteristic variables. An arithmetic logic unit is designed to check, on reception of the request message, the shift in the operational limit of at least one of the characteristic variables depending on at least one operation history which is stored for the energy store and represents information derived from one or more of the characteristic variables of the energy store and relating to past operating conditions of the energy store, and to permit the shift in the operational limit when at least one of the following conditions has been met: information which is established from the at least one operation history and represents the present state of health meets a preset criterion. Alternatively or in addition, the condition whereby a monetary transaction initiated by the arithmetic logic unit depending on the present state of health has been concluded needs to be met.

A request message within the meaning of the present description contains modification information, such as, for example, the request for an (additional) quick-charge operation, a temporary increase in the power (in order to be able to achieve, for example, increased acceleration and/or final speed), an increased range or the like. A shift in the operational limit of at least one characteristic variable, for example a maximum possible charging voltage, a maximum possible discharging voltage, a maximum possible charging or discharging current, a minimum possible state of charge (SoC) or the like, which is intended by a user and is technically required is associated with the modification information obtained in the request message.

A temporary change or shift in the operational limit of at least one of the mentioned characteristic variables is possible when a state of health derived from the at least one operation history stored for the energy store allows the shift in the at least one characteristic variable without the electrical energy store suffering from irreversible damage. Since, as a result of the intended shift in the operational limit of at least one of the characteristic variables, however, an originally guaranteed life of the electrical energy store can be negatively influenced, the permission for the shift in the at least one operational limit can be made dependent not only on the present state of health but additionally also on the conclusion of a monetary transaction. In other words, the shift in the operational limit of at least one of the characteristic variables can take place by virtue of the payment of a fee and thereby a possible financial reserve for a premature guarantee case.

As a result, the needs of customers who desire, for example, increased (charging/discharging) powers and/or increased ranges and to achieve this accept a shorter guarantee time, for example, can be accommodated. Likewise, in the event of an unchanged guarantee time, an increased risk of failure can be mitigated in financial terms by building a reserve.

In accordance with an expedient configuration, provision is made for the criterion to be considered as being met by the arithmetic logic unit when the information established from the at least one operation history is greater than a previously determined, aging-dependent limit threshold value at the time of the determination of the characteristic variable. In other words, the modification information contained in the request message can be approved when the present state of health is better than a limit state of health predetermined for the current time which, when exceeded, could or would result in damage to the energy store. The limit state of health therefore represents an absolute limit which should not be exceeded, not even with payment of a fee.

A further configuration provides for the criterion to be considered as being met by the arithmetic logic unit when the established information is greater than a previously determined, aging-dependent design threshold value at the time of the determination of the characteristic variable. The design threshold value, in contrast to the limit threshold value, is a threshold value defined in the worst case scenario for a respective aging point of the life of the electrical energy store. If the presently established state of health is better than the state of health established in the worst case scenario for that time, the modification information contained in the request message and relating to an intended shift in the operational limit of at least one of the characteristic variables can be approved.

The criterion can also be considered as being met by the arithmetic logic unit when the established information is less than the previously determined, aging-dependent design threshold value at the time of the determination of the characteristic variable. In this case, the present state of health is poorer than that defined in the context of the worst case scenario, but the present state of health is better than the previously determined, aging-dependent limit threshold value at which there would be a risk of direct damage to the electrical energy store. Even in this case it is possible for a shift in the operational limits of at least one of the characteristic variables to be permitted, in particular with payment of a fee for taking into consideration an increased and/or premature failure risk of the electrical energy store.

Expediently, the device comprises a data memory, in which the at least one operation history is stored for the energy store. The data memory may be a data memory assigned to the energy store as a whole. Alternatively, the energy store may comprise a number of storage cell modules, wherein a data memory element is assigned to each of the storage cell modules, wherein the totality of the data memory elements forms the data memory. In a further alternative configuration, provision can be made for each of the storage cell modules to comprise a number of storage cells, wherein a data memory element is assigned to each of the storage cells, wherein the totality of the data memory elements forms the data memory.

In particular, the data memory or the data memory elements can be designed or can be connected to components which are designed to enable the capture of the at least one characteristic variable of the energy store or the storage cell module or the storage cells.

A further expedient configuration provides for the data memory to be designed to exchange data with the control unit of the energy store and to transmit, as part of a data communication, the one or more characteristic variables or the at least one operation history. As a result, it is made possible for the control unit to establish the present state of health in order to establish, on the basis thereof, the decision with respect to the shift in the operational limit of at least one of the characteristic variables.

In accordance with a further expedient configuration, provision is made for the data memory to be designed to transmit, as part of the data communication with the control unit, a credential for an authentication. In accordance with this configuration, the data memory is part of a chip, which has communication and cryptographic arithmetic functions in order to perform the data communication with the control unit.

A further expedient configuration provides for the arithmetic logic unit to be designed to simulate the state of health corresponding to the requested exceeding of the operational limit by means of a model of the energy store in order to check the effect of the requested exceeding of the operational limit of at least one of the characteristic variables. On the basis of the simulation result, the permission for the shift in the operational limit of the at least one characteristic variable can then be granted or not.

The arithmetic logic unit is in particular a vehicle-external arithmetic logic unit. The vehicle-external arithmetic logic unit may be, for example, a server of a backend of the manufacturer of the electrically operated motor vehicle. Alternatively, the arithmetic logic unit may also be, however, a vehicle-internal arithmetic logic unit if the decision with respect to the shift in the operational limit of at least one of the characteristic variables is based exclusively on the judgment of the present state of health of the electrical energy store.

In accordance with a second aspect, the invention proposes a method for operating an electrical energy store, in particular for supplying power to components of an electrically operable motor vehicle, wherein operational limits are defined in each case for one or more characteristic variables of the energy store, wherein the exceeding of the operational limits is monitored during normal operation of the energy store by a control unit. The method comprises the step of receiving a user-side request message from an appliance which contains modification information relating to an intended shift in the operational limit of at least one of the characteristic variables. The appliance may be a vehicle-external appliance or an interface of the vehicle. A user interface of the vehicle is, for example, a man-machine interface, for example a rotary pushbutton actuator, in conjunction with a display unit of the vehicle. In addition, the method comprises the step of checking the shift in the operational limit of at least one of the characteristic variables depending on at least one operation history which is stored for the energy store and represents information derived from one or more of the characteristic variables of the energy store and relating to past operating conditions of the energy store on reception of the request message and permitting the shift when at least one of the following conditions has been met: information which is established from the at least one operation history and represents the present state of health meets a preset criterion; a monetary transaction initiated by the arithmetic logic unit depending on the present state of health has been concluded.

The method has the same advantages as those described above in conjunction with the device according to the invention.

In accordance with an expedient configuration, the criterion is established as being met by the arithmetic logic unit when the established information is greater than a previously determined, aging-dependent limit threshold value at the time of the determination of the characteristic variable. The limit threshold value represents an absolute, time-dependent or distance-dependent threshold value which, when exceeded, could or would result in the occurrence of irreversible damage to the electrical energy store.

In an expedient configuration, the criterion is established as being met by the arithmetic logic unit when the established information is greater than a previously determined, aging-dependent design threshold value at the time of the determination of the characteristic variable. The criterion is established optionally also as being met by the arithmetic logic unit when the established information is less than the previously determined, aging-dependent design threshold value at the time of the determination of the characteristic variable. The design threshold value is a threshold value which is established within the context of the worst case scenario mentioned at the outset and which, when exceeded, does not directly endanger the state of health of the electrical energy store but may have effects on the life of the electrical energy store.

A further expedient configuration provides for, on reception of the request message, as part of a data communication, the one or more characteristic variables or the at least one operation history to be transmitted from the energy store to the arithmetic logic unit for determining the information. For this purpose, the data memory mentioned at the outset can have a communication function in order to implement the data communication with the arithmetic logic unit.

As part of the data communication, provision can be made in particular for a credential of a data memory for authentication to be transmitted to the arithmetic logic unit. As a result, the communication between the energy store and the arithmetic logic unit can be made secure, with the result that, for example, manipulation for shifting the operational limit of at least one of the characteristic variables by a third party can be prevented or at least made more difficult.

In accordance with a further expedient configuration, the arithmetic logic unit simulates the state of health corresponding to the requested exceeding of the operational limit by means of a model of the energy store in order to check the effect of the requested exceeding of the operational limit of at least one of the characteristic variables. Depending on the simulation result, the shift in the operational limit of at least one of the characteristic variables can then be selectively permitted or prevented.

The invention further proposes a computer program product which can be loaded directly into the internal memory of a digital computer and comprises software code modules with which the method steps are implemented when the product is running on a computer. The computer program product may be present in the form of a data memory, such as, for example, a DVD, a CD-ROM, a USB memory stick or the like. The computer program product may also be in the form of a signal which can be transmitted over a wireless or wired network.

The invention will be described in more detail below with reference to an exemplary embodiment in the drawings.

DETAILED DESCRIPTION OF THE DRAWINGS

Figure 1:
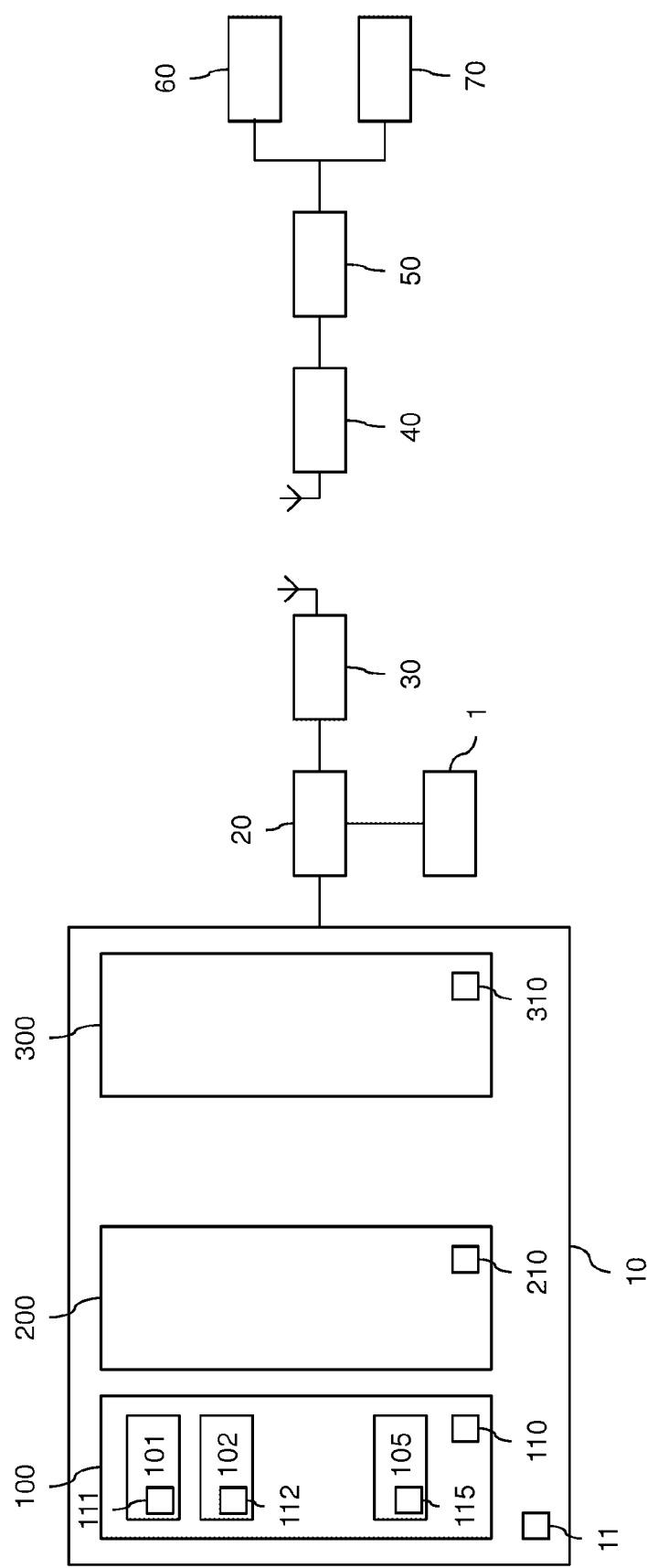
FIG. 1 is a schematic illustration of a device according to an embodiment of the invention for operating an electrical energy store.

FIG. 1 shows a device for operating an electrical energy store 10. The electrical energy store 10 represents an energy store for supplying power to components of an electrically operable vehicle, in particular a drive machine thereof. The electrical energy store 10 comprises a number of storage cell modules 100, 200, 300. The number of storage cell modules 100, 200, 300 can be selected in principle as desired. Each of the storage cell modules 100, 200, 300 in turn comprises a number of storage cells, wherein, by way of example, storage cells 101, . . . , 105 are only illustrated in the storage cell module 100.

In a preferred configuration, each of the storage cells 101, . . . , 105 of a respective storage cell module 100, 200, 300 has a data memory 111, . . . , 115. The data memory 111, . . . , 115 has, in addition to the possibility of storing various data which will be described in more detail below, communication capabilities for data interchange with a control unit 20 of the electrical energy store 10 and optionally means for determining one or more characteristic variables of the assigned storage cells 101, . . . , 105. Characteristic variables of the energy store which are stored may be, for example, various histograms of past operating states of the respective voltages, charging and/or discharging currents, temperatures and states of charge (SoC), in each case in the form of maximum, minimum and average values. Furthermore, a so-called credential, i.e. a unique identification feature, of the assigned storage cell 101, . . . , 105 is stored in the data memory. The credential is protected by cryptographic methods and can be verified by a receiver of the credential. The data memories 111, . . . , 115 can, for this purpose, also have an arithmetic logic unit, which is suitable for implementing cryptographic operations. The data memories 111, . . . , 115 of respective storage cells 101, . . . , 105 represent data memory elements within the meaning of the invention, wherein the totality of all of the data memory elements forms a data memory of the electrical energy store 10.

Although it is preferred if each of the storage cells 101, . . . , 105 of a respective storage cell module 100, 200, 300 has in each case such a data memory 111, . . . , 115, in one modification provision may be made for corresponding data memories 110, 210, 310 to be provided only for a respective storage cell module 100, 200, 300. If a data memory 110, 210, 310 is assigned to a respective storage cell module 100, 200, 300, these represent data memory elements. The totality of the data memory elements forms a data memory of the electrical energy store 10. In a further alternative configuration, such a data memory 11 may also be assigned only to the electrical energy store 10 as a whole.

The control and monitoring of the electrical energy store 10 takes place by means of a control unit 20 assigned to the electrical energy store 10. The control unit 20 is designed, for example, to monitor operational limits defined for various characteristic variables (voltage U, current I, temperature T, state of charge SoC, etc.) and to prevent these operational limits from being exceeded during normal operation of the energy store.

The control unit 20 is connected to a user interface 1, for example a man-machine interface (MMI) of the motor vehicle in which the electrical energy store 10 is provided. A user of the motor vehicle is given the opportunity via the user interface 1 to transmit request messages which contain modification information relating to an intended shift in the operational limits of one or more characteristic variables of the electrical energy store 10. Processing of the request message takes place in particular on the side of a vehicle-external arithmetic logic unit, in particular a backend of the manufacturer of the motor vehicle. For communication required for this purpose, the device also has a vehicle-side transceiver unit 30.

The vehicle-side transceiver unit 30 is designed to communicate with a vehicle-external (backend) transceiver unit 40. The transceiver unit 40 for its part is connected to a vehicle-external arithmetic logic unit 50. Furthermore, the backend comprises an invoicing system 60 coupled to the arithmetic logic unit 50 and a simulation unit 70 coupled to the arithmetic logic unit 50.

It should be noted that the processing of a user-side request message does not necessarily need to take place in a vehicle-external arithmetic logic unit. In an alternative configuration, components provided for this purpose can also be implemented on the vehicle side.

A user of the motor vehicle may submit a request for an additional quick-charge operation via the user interface 1, for example, by means of generating a request message. An additional quick-charge operation requires that the charging of the electrical energy store 10 takes place with a current which is (substantially) higher than that used for normal charging. The request can also comprise, for example, a temporary increase in the power by a certain value, for example in order to be able to achieve an increased maximum speed with the motor vehicle. This would require that the discharging current and/or the voltage would be increased. A request can also comprise an increase in the range by a certain percentage, which would entail a lower depth of discharge than a preset threshold value.

The control unit receiving the request message now transmits the credentials of the storage cells 101, ..., 105 via the vehicle-side transceiver unit 30 to the vehicle-external transceiver unit 40, which transmits the information to the arithmetic logic unit 50. With the aid of the credentials, the processing of the information contained in the request message can be made secure. Whether the shift in the operational limit of one or more characteristic variables which is contained in the request message is permitted or refused is established depending on the present state of health, which is determined from an operation history stored for the energy store. The operation history represents information derived from one or more of the characteristic variables (in particular voltage U, current I, temperature T, state of charge SoC) of the energy store and relating to past operating conditions of the energy store. These are stored in the data memory (whether it be in the data memory 11 assigned to the energy store 10 as a whole or the data memory elements of the storage cell modules or the storage cells). The operation history is in particular in the form of histograms of the past operating states and enables, by virtue of a comparison with a previously stored worst case scenario, the decision as to whether, for technical reasons, a shift in the operational limits of at least one of the characteristic variables is possible or not.

Alternatively or in addition, the enabling of the shift in the limit value can take place by means of an initiated monetary transaction. Enabling is implemented, for example, when a user account could be debited, via the invoicing system 60, a monetary amount which takes into consideration the impairment of the aging response owing to the temporary shift in the operational limit of at least one of the characteristic variables. As a result, for example, any repair work which may be necessary prior to expiry of the predicted guarantee time can be taken into consideration in monetary terms. The arithmetic logic unit 50 can request, for the purpose of determining the state of health, the operation history or operation histories which are stored in the data memory of the energy store 10, as a result of which the operation history or histories are transmitted from the vehicle-side transceiver unit 30 to the vehicle-external transceiver unit 40.

The data received from the arithmetic logic unit 50 can be passed on from the arithmetic logic unit to the simulation unit 70 before a decision is made with respect to enabling of the request message. In the simulation unit 70, a model of the electrical energy store is developed in order to simulate the effect of the requested temporary shift in the operational limit of at least one of the characteristic variables. Depending on the simulation result, for example, the value of the monetary transaction can be determined or else, for technical reasons, permission of the requested shift in the operational limit of at least one of the characteristic variables can be refused or granted.

The principle on which the invention is based therefore consists in that of providing the energy store, in particular the individual storage cells, with an authentication possibility and stored operation histories in order to transmit the operation histories to a (vehicle-external) arithmetic logic unit. A user-side request message as to whether operational limits can be temporarily shifted, in particular extended, is then negotiated by the arithmetic logic unit 50. If the shift in the operational limits is permitted by the arithmetic logic unit 50, the transmission of a corresponding enable message to the control unit 20 of the electrical energy store takes place. Under the control of the control unit 20, the temporarily newly set operational limits can then be processed. The shift in the operational limits can be taken into consideration either by the monetary transaction and/or a reduction in the guarantee time.

Figure 4:
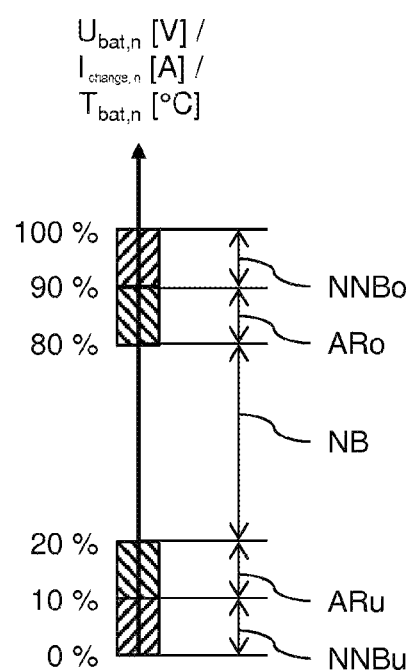
FIG. 4 is a schematic illustration illustrating threshold values defined for various characteristic variables of an electrical energy store.

The shift in the operational limit(s) of characteristic variables of the electrical energy store forms the basis of the consideration described below. FIG. 4 shows, by way of example, normalized value ranges for the characteristic variables of the battery voltage $U_{bat,n}$ of the charging current $I_{charg,n}$ and the battery temperature $T_{bat,n}$. A normal range NB is, for example, in a range of between 20% and 80% of the normalized value ranges. The limits of an upper and lower design reserve range ARo and ARu are, for example, between 80% and 90% and between 10% and 20% of the normalized value ranges. Unusable ranges NNBo and NNBu which damage the storage cells of the electrical energy store 10 are, for example, between 90% and 100% and 0% and 10%. The selected ranges and the limit values resulting between adjacent ranges are selected arbitrarily for the purposes of illustration.

The control unit 20 is designed to keep the respective characteristic variables in their normal range, for example between 20% and 80%, during normal operation. If the request for a shift in the operational limit of at least one of the characteristic variables (U, I, T) is granted, the capacity utilization of the upper or lower design reserve range ARo and ARu is temporarily enabled. The unusable range NNBo and NNBu should be avoided under all circumstances since here direct and unpredictable damage to the storage cells of the energy store can take place.

As described at the outset, the electrical energy store 10 is dimensioned under the assumption of a worst case scenario. The worst case scenario is based on the most severe operating conditions and customer requests which are characterized by attempts and experiences from the past by a temperature collective, a load collective and generally histograms of the characteristic variables of the energy store and the operating states thereof. The worst case scenario results in a characteristic K1 (FIGS. 2 and 3) which in this case shows, by way of example, a state of health SoHc of the battery capacity depending on a design. The design may be, for example, a lifetime t guaranteed to the customer in years or a guaranteed running power s in km. The characteristic K1 indicates the worst case scenario, starting from a state of health SoHc=100% at the beginning of the life cycle up to a state of health SoHc=0% at the end of the life cycle, i.e.

up to expiry of the guaranteed running time $t_{exp}$ or running power $s_{exp}$. The state of health SoHc=0% indicates, for example, that the still maximally usable battery capacity is, for example, 70%.

Figure 2:
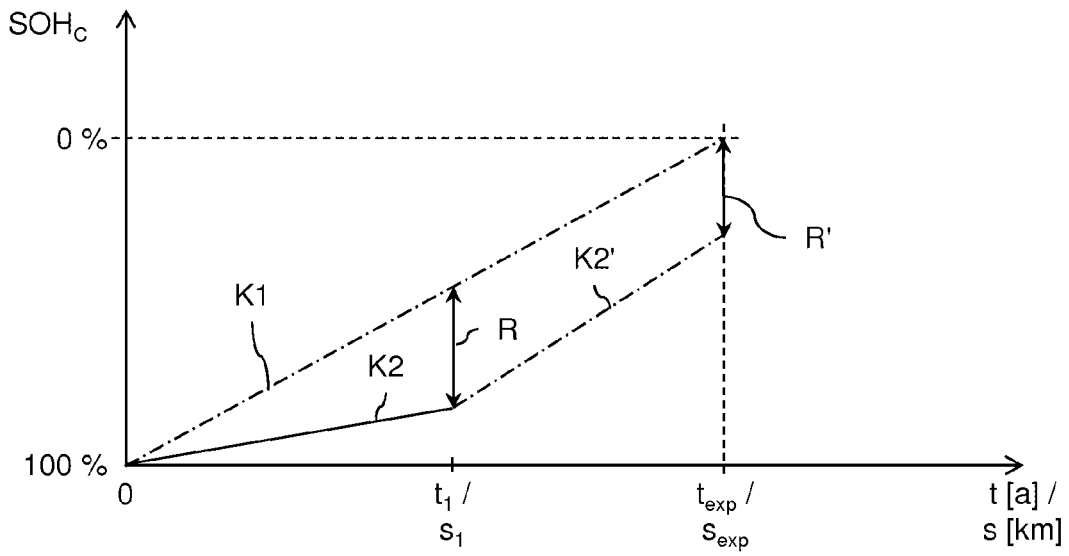
FIG. 2 is a graph visualizing the state of health of the electrical energy store shown in FIG. 1 as a function of time or a covered distance, wherein the principal procedure of an exemplary method according to the invention is illustrated using the graph.

The typical user will use the energy store far below the most severe operating conditions, with the result that an actual profile of the state of health, which is characterized by K2 in FIGS. 2 and 3, results owing to the operation history detected over the course of the use of the motor vehicle and the energy store. At time $t_1$ or at a specific running power $s_1$, there is a difference between the characteristic K1 of the worst case scenario and the actual profile of the state of health according to characteristic K2. The greater the spacing between the two characteristics at the time of a request message (expressed by the arrow R), the less critical temporary exceeding of or a shift in the operational limits of at least one characteristic variable is. If the state of health SoHc is therefore greater than the state of health of the worst case scenario at time $t_1$ or at running time $s_1$, which represents the design threshold value, from a technical point of view the request for a shift in the operational limit of at least one characteristic can be granted. This results in a different predicted profile of the further state of health, which is characterized by the dashed line K2'. Since at the expected end of life of the energy store there is still a sufficiently large reserve R' (corresponding to the spacing between the characteristics K1 and K2), the temporary shift in the limit value of at least one characteristic variable will have no effect on an expected guarantee case, with the result that the shift in the operational limit cannot or does not need to be provided, or only at a low price.

Figure 3:
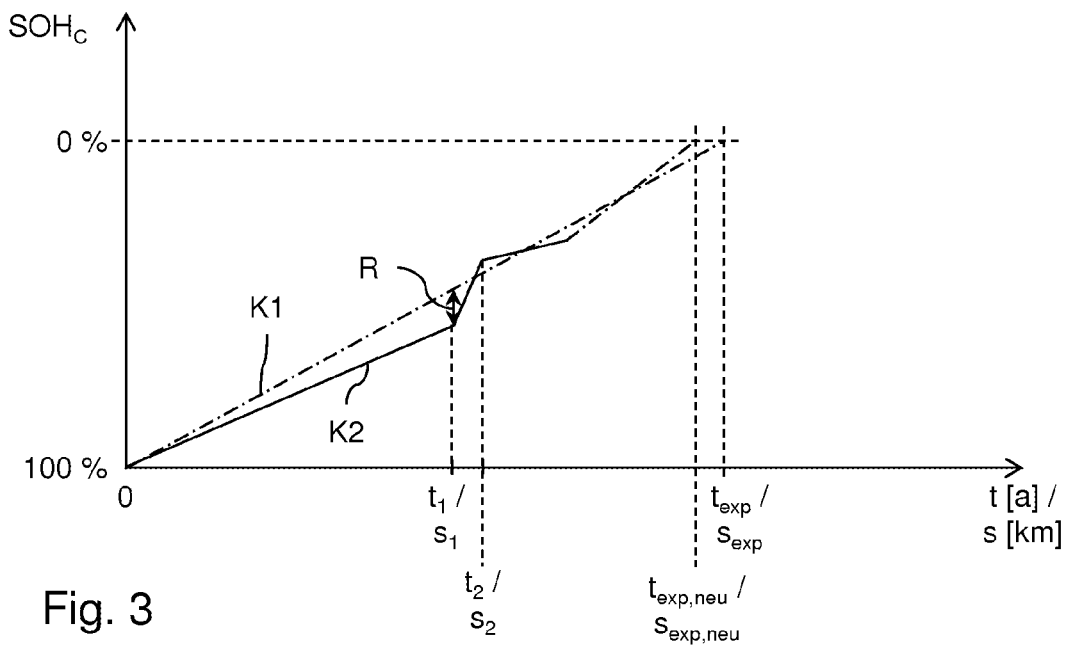
FIG. 3 is a development of the graph shown in FIG. 2 which illustrates the profile of the state of health over time or a covered distance and possible shifts, derived therefrom, in the operational limits of individual characteristic variables.

In contrast, FIG. 3 shows an exemplary embodiment in which, at time $t_1$ or at running time $s_1$, there is only a small reserve R of the states of health between the characteristics K1 and K2. A simulation of the requested shift in the operational limit of the at least one characteristic variable could therefore result in the characteristic K1 being exceeded up until the permission is withdrawn at time $t_2$ or at running time $s_2$. As a result, it is no longer possible to guarantee that, at the originally calculated time $t_{exp}$ or at the originally calculated running power $s_{exp}$, the energy store will still provide the power assured for customer requests. Instead, the state of health SoHc=0% is present at an earlier time $t_{exp}$, new or at an earlier running power $s_{exp}$, new. The permission for enabling of the operational limit of the at least one characteristic variable can therefore be made depending on the conclusion of a monetary transaction. In this case, the consideration is based on the fact that exceeding of the operational limit of the at least one characteristic variable does not necessarily need to result in a defect in or damage to the energy store, but a certain probability of an early problem will occur. As a result, a corresponding financial reserve can be formed by the monetary transaction.

LIST OF REFERENCE SYMBOLS 1 user interface
10 energy store
11 chip with credential
20 control unit
30 vehicle-side transceiver unit
40 backend transceiver unit
50 arithmetic logic unit
60 invoicing system
70 simulation unit
100, 200, 300 storage cell module
101, . . . , 105 storage cells of storage cell module 100
110, 210, 310 chip with credential
115 chip with credential
K1, K2 characteristics
U, I, T, SoC characteristic variables

What is claimed is:

1. A device for operating an electrical energy store for supplying power to components of an electrically operable motor vehicle, wherein operational limits are defined in each case for one or more characteristic variables of the energy store, wherein exceeding of the operational limits is prevented, during normal operation of the energy store, by a control unit, comprising:
an interface for receiving, from an appliance, a user-side request message which contains modification information relating to an intended shift in an operational limit of at least one of the characteristic variables;
an arithmetic logic unit, which is designed to check, on reception of the request message, the intended shift in the operational limit of at least one of the characteristic variables depending on at least one operation history which is stored for the energy store and represents information derived from one or more of the characteristic variables of the energy store and relating to past operating conditions of the energy store, and to permit said intended shift when at least one of the following conditions has been met:
(i) information, which is established from the at least one operation history and represents the present state of health, meets a preset criterion;
(ii) a monetary transaction initiated by the arithmetic logic unit depending on the present state of health has been concluded.

2. The device according to claim 1, wherein
the criterion is considered as being met by the arithmetic logic unit when the established information is greater than a previously determined, aging-dependent limit threshold value at the time of the determination of the characteristic variable.

3. The device according to claim 1, wherein
the criterion is considered as being met by the arithmetic logic unit when the established information is greater than a previously determined, aging-dependent design threshold value at the time of the determination of the characteristic variable.

4. The device according to claim 1, wherein
the criterion is considered as being met by the arithmetic logic unit when the established information is less than the previously determined, aging-dependent design threshold value at the time of the determination of the characteristic variable.

5. The device according to claim 1, further comprising:
a data memory, in which the at least one operation history is stored for the energy store.

6. The device according to claim 5, wherein
the data memory is a data memory assigned to the energy store as a whole.

7. The device according to claim 5, wherein
the energy store comprises a number of storage cell modules,
a data memory element is assigned to each of the storage cell modules, wherein a totality of the data memory elements forms the data memory.

8. The device according to claim 5, wherein
the energy store comprises a number of storage cell modules, each of the storage cell modules having a number of storage cells, a data memory element is assigned to each of the storage cells, wherein a totality of the data memory elements forms the data memory.

9. The device according to claim 5, wherein the data memory is designed to exchange data with the control unit of the energy store and to transmit, as part of a data communication, the one or more characteristic variables or the at least one operation history.

10. The device according to claim 9, wherein the data memory is designed to transmit, as part of the data communication with the control unit, a credential for an authentication.

11. The device according to claim 1, wherein the arithmetic logic unit is designed to simulate the state of health corresponding to a requested exceeding of the operational limit by way of a model of the energy store in order to check the effect of the requested exceeding of the operational limit of at least one of the characteristic variables.

12. The device according to claim 1, wherein the arithmetic logic unit is a vehicle-external arithmetic logic unit.

13. A method for operating an electrical energy store for supplying power to components of an electrically operable motor vehicle, wherein operational limits are defined in each case for one or more characteristic variables of the energy store, wherein exceeding of the operational limits is monitored during normal operation of the energy store by a control unit, the method comprising the steps of:
  receiving, from an appliance, a user-side request message which contains modification information relating to an intended shift in the operational limit of at least one of the characteristic variables;
  checking, via an arithmetic logic unit, the intended shift in the operational limit of at least one of the characteristic variables depending on at least one operation history which is stored for the energy store and represents information derived from one or more of the characteristic variables of the energy store, and relating to past operating conditions of the energy store, on reception of the request message, and
  permitting the shift when at least one of the following conditions has been met:
    (i) information, which is established from the at least one operation history and represents the present state of health, meets a preset criterion;
    (ii) a monetary transaction initiated by the arithmetic logic unit depending on the present state of health has been concluded.

14. The method according to claim 13, wherein the criterion is established as being met by the arithmetic logic unit when the established information is greater than a previously determined, aging-dependent limit threshold value at the time of the determination of the characteristic variable.

15. The method according to claim 13, wherein the criterion is established as being met by the arithmetic logic unit when the established information is greater than a previously determined, aging-dependent design threshold value at the time of the determination of the characteristic variable.

16. The method according to claim 13, wherein the criterion is established as being met by the arithmetic logic unit when the established information is less than a previously determined, aging-dependent design threshold value at the time of the determination of the characteristic variable.

17. The method according to claim 13, wherein on reception of the request message, as part of a data communication, the one or more characteristic variables or the at least one operation history is transmitted from the energy store to the arithmetic logic unit for determining the information.

18. The method according to claim 17, wherein as part of the data communication, a credential of a data memory for authentication is transmitted to the arithmetic logic unit.

19. The method according to claim 13, wherein the arithmetic logic unit simulates the state of health corresponding to the requested exceeding of the operational limit by way of a model of the energy store in order to check the effect of the requested exceeding of the operational limit of at least one of the characteristic variables.

20. A computer product comprising a non-transitory computer readable medium having stored thereon software code modules which, when executed by a processor, carry out:
  receiving a user-side request message which contains modification information relating to an intended shift in the operational limit of at least one of the characteristic variables;
  checking via the intended shift in the operational limit of at least one of the characteristic variables depending on at least one operation history which is stored for the energy store and represents information derived from one or more of the characteristic variables of the energy store, and relating to past operating conditions of the energy store, on reception of the request message; and
  permitting the shift when at least one of the following conditions has been met:
    (i) information, which is established from the at least one operation history and represents the present state of health, meets a preset criterion;
    (ii) a monetary transaction initiated depending on a present state of health has been concluded.

* * * * *